(12) United States Patent
Xu et al.

(10) Patent No.: US 6,479,396 B1
(45) Date of Patent: Nov. 12, 2002

(54) DRY POLYMER AND OXIDE VEIL REMOVAL FOR POST ETCH CLEANING

(75) Inventors: Han Xu, Lexington; Amy Ying Shen, Wakefield, both of MA (US); Phillip Gerard Clark, Jr., Hampton, NH (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/794,055

(22) Filed: Feb. 28, 2001

(51) Int. Cl.$^7$ .............................................. H01L 21/00
(52) U.S. Cl. ........................ 438/723; 216/67; 216/75; 216/79; 438/720; 438/725; 438/734; 438/743; 438/742
(58) Field of Search ................................ 438/710, 720, 438/723, 725, 734, 742, 737, 743

(56) References Cited

U.S. PATENT DOCUMENTS

| | | | |
|---|---|---|---|
| 5,853,602 A | * 12/1998 | Shoji ...................... | 438/720 X |
| 5,858,878 A | * 1/1999 | Toda ...................... | 438/725 X |
| 6,030,901 A | * 2/2000 | Hopper et al. .......... | 438/725 X |
| 6,214,744 B1 | * 4/2001 | Wada ...................... | 438/723 |
| 6,352,938 B2 | * 3/2002 | Chen et al. .............. | 438/725 |

\* cited by examiner

Primary Examiner—William A. Powell

(57) ABSTRACT

In a process of preparing a via in a semiconductor substrate wafer in which vias are landed on tungsten, and in which resist is stripped using plasma or chemical based processes that do not remove the veils formed during the etch, the improvement of concurrently removing veil material, controlling the interface of the tungsten, and stripping the resist, comprising:

a) depositing and patterning tungsten on a substrate;
b) depositing an oxide as an interlevel dielectric on the tungsten;
c) patterning the oxide using photolithography and a photoresist;
d) etching the oxide using a plasma generated etching method in which veils made up of metals, carbon based materials and oxide based materials are formed on the tungsten and sidewalls of the vias; and
e) stripping the resist using a dry polymer removal method employing process gases and reducing gases to concurrently cause resist stripping, removal of the veils, and control of the tungsten interface.

16 Claims, 6 Drawing Sheets

THIN INSULATING LAYER HAS SEEN BY TEM

DRY POLYMER AND OXIDE VEIL REMOVAL FOR POST ETCH CLEANING

BACKGROUND OF THE INVENTION

1. Field of Invention

The invention relates to a dry method for removing polymer and oxide veils for vias disposed on a Tungsten layer resulting from etching and controlling or partially removing the tungsten base or interface layer to create an undercut of the via to provide better plug adhesion when the via is filled.

2. Description of the Prior Art

During the making of a semiconductor chip structure in which a tungsten layer is deposited on a substrate material, and in which an oxide is deposited on the tungsten layer as an interlevel dielectric (ILD), and on which a photoresist is subsequently placed on the interlevel dielectric, followed by etching and photolithographic resist removal, veils are created in the vias and on the tungsten layer. This is so because the vias are etched through insulators and the etch progress stops on the tungsten.

Unfortunately, the etch process causes organic-metal oxides, veils, and other materials to form on the tungsten as well as on the sidewalls of the vias. Additionally, there is a thin-oxide formed on the tungsten during etching and photolithographic resist removal that must be penetrated.

Removal of these veil materials has historically been accomplished using wet chemistries and therefore encumbered by the disadvantages associated with these wet chemistries.

FIG. 1 depicts a typical starting semiconductor structure wherein a substrate material 10 has a tungsten layer 11 deposited for subsequent patterning. An oxide layer as an interlevel dielectric (ILD) 12 is deposited on top of the tungsten layer, and a photoresist 13 is deposited on top of the ILD layer. In the process of forming this basic structure that is well known in the art, the oxide layer is patterned using photolithography and a typical photoresist, whereupon the oxide etch is performed using a plasma generated etching method employing various wet chemistries. However, during this etch, polymer veils 14 and oxide veils 15 are formed that are made up of metals, carbon, and oxide-based materials.

Nevertheless, when the resist is stripped using known plasma based or chemical based processes, these processes do not remove the veils formed during the etch. The problems encountered by virtue of these oxide and polymer veils are well known in the art.

Accordingly, there is a need in the art of stripping resist following etch of a semiconductor chip structure in which a tungsten layer is deposited on a substrate material, to be able to remove polymer and oxide veils from sidewalls of vias, to remove the thin oxide formed on the tungsten layer, and to control the tungsten interface and therefore high contact resistance after etch and photolithographic resist removal, by other than the wet chemistries now used.

SUMMARY OF THE INVENTION

One object of the present invention is to provide a dry process for removal of polymer and oxide veils from sidewalls of vias and on the interface of a tungsten layer of a semiconductor following oxide etch of an interlevel dielectric.

Another object of the present invention is to provide a RIE (reactive ion etching) method for removal of polymer and oxide veil's from sidewalls of vias and on the interface of a tungsten layer of a semiconductor following oxide etch of an interlevel dielectric.

A further object of the present invention is to provide a dry process for removal of polymer and oxide veils from sidewalls of vias and on the interface of a tungsten layer of a semiconductor following oxide etch of an interlevel dielectric in a manner so as to avoid the high contact resistance when an insulator interface is not removed from the tungsten surface and to limit the attack on tungsten to avoid unacceptable tungsten loss.

A yet further object of the present invention is to provide improved C1 contact adhesion after C1 polymer removal to obtain a better surface for the tungsten contact to adhere to, as a result of the undercut of the C1 via.

In general, the invention process is accomplished by:

depositing tungsten on a substrate material and patterning the tungsten;

depositing an interlevel dielectric of an oxide on the tungsten layer;

depositing a photoresist on the oxide layer and patterning the oxide layer using photolithography and photo resist;

performing an oxide etch using a plasma generated etching method, wherein oxide veils are formed of metals, and carbon and oxide based materials; and removing the veil materials by RIE (reactive ion etching) to provide a dry polymer clean.

DETAILED DESCRIPTION OF PREFERRED EMBODIMENT OF THE INVENTION

In its essence, the invention pertains to a polymer veil removal method for vias that are landed on tungsten, that is, the vias are etched through insulators and the etch stops on the tungsten layer.

Figure 1:
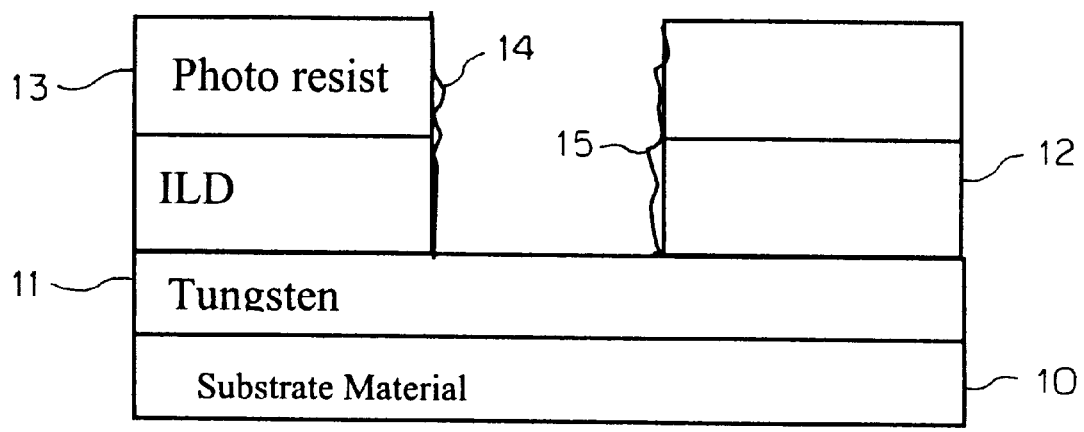
FIG. 1 depicts a prior art basic starting structure of a semiconductor upon which polymer veils, and oxide veils are formed on the walls and the tungsten interface of the via from plasma etching.

The normal etch process causes organic-metal oxides, and veils to form on the tungsten and on the sidewalls of the vias. This is graphically depicted in FIG. 1, which shows a prior art semiconductor structure wherein a substrate material 10 having a tungsten layer 11 deposited thereon is subsequently subjected to patterning. An oxide layer 12 is deposited on the tungsten layer as an interlevel dielectric (ILD), and a photoresist 13 is deposited on top of the ILD oxide layer.

In the prior art process of forming this basic semiconductor structure, the oxide layer is patterned using photolithography and a typical photoresist whereupon the oxide etch is performed using a plasma generated etching method employing various chemistries. An attendant disadvantage resulting from the etch is that polymer veils 14 and oxide veils 15 are formed that are made up of metals, carbon, and oxide-based materials in general. An additional thin oxide layer (not shown) is formed on the tungsten during the etch and photolithographic resist removal that must be penetrated in order to ensure that the contact resistant is not too high; however, care must be taken that removal of the thin oxide interface insulator does not also remove tungsten in amounts greater than that which is acceptable.

In any case, removal of the veils on the sidewalls and the thin oxide formed on the tungsten during etch has historically been accomplished with wet chemistries and therefore encumbered by the known disadvantages associated with the use of these wet chemistries.

In accordance with the process of the present invention process parameters are utilized for removal of the veils in sidewalls of the vias coupled with the control of the tungsten interface to ensure that only an acceptable level of tungsten loss is obtained when the tungsten is attacked during the veil removal process.

It has been found that there are two limiting factors or boundary conditions controlling the process window when removing veils and penetrating the thin oxide formed on the tungsten during etch and photolithographic resist removal. The first boundary condition is high contact resistance that is experienced when an insulator interface is not removed from the tungsten surface. The second boundary condition is that, upon removing the insulator interface the amount of the tungsten attacked must be such that only an acceptable tungsten loss is obtained.

The present invention accomplishes these objectives by utilizing a dry polymer removal process that uses a RIE (reactive ion etching) to affect dry polymer cleaning. This dry polymer removal or cleaning is performed at elevated temperatures so that the resist can be stripped and the polymer can be removed in the same step. In this connection, fluorine based chemistries are used at elevated temperatures in a manner so that attack of the tungsten results in distinct process windows that are dependent on total flow, fluorine source to reducing ambient ratio, and the amount of power. Accordingly, the invention process establishes the process windows and operating parameters determined experimentally to overcome the two limiting factors when removing polymer veils and the thin oxide formed on the tungsten during etch and lithographic resist removal.

EXAMPLE

Veil Removal

Typical Tool Configuration

The veil removal is done in a vacuum chamber using microwave downstream plasma and reactive ion etching capabilities operating at radio frequencies not limited to but typically 13.56 mHz. The wafers are positioned on a heated platen for improved process control. Process gases for deveiling include fluorine based gases ($CF_4$, $NF_3$) and reducing gases such as forming gas ($N_2[100\%-X\%]/H_2\{X\%\}$), argon, nitrogen or helium.

The process is restricted between two device failure criteria. First is the oxidation of the tungsten and second is the attack on the tungsten at elevated temperatures.

Boundary Condition 1: Interfacial Insulator Penetration. At high gas flows there exists a region of oxidation of the tungsten which inhibits the contact resistance from 2× to 1000×.

Boundary Condition 1 is sensitive to the flow of total reactants, fluorine source ($NF_3$ or $CF_4$); power and clean time. This process boundary condition follows the following basic trends:

1) If the Fluorine source is diluted too much, the insulator interface is not penetrated. As the total gas flow is increased, the process window widens;

2) Increasing the radicalized fluorine eliminates this interface. Increase the microwave power or RF power source removes this interface;

3) As fluorine concentration is decreased, the power required for penetrating the insulator increases; and 4) Clean time in the fluorine ambient affects the penetration of the insulator interface but is secondary to power and gas flows.

Figure 2:
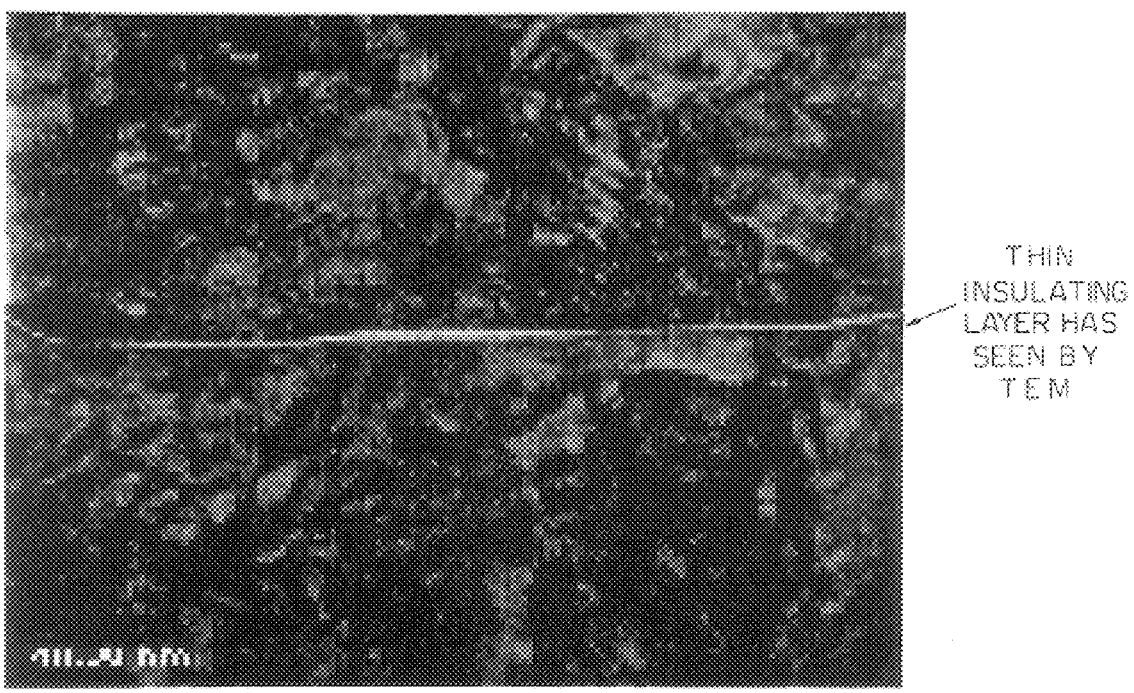
FIG. 2 is a photograph of magnification 1000× showing a TEM of a thin insulating layer of an oxide interface.

Reference is now made to FIG. 2, which shows the oxide interface insulator penetration. At high gas flows there exists a region of oxidation of the tungsten, which inhibits the contact resistance from 2× to 1,000×. The oxide interface in FIG. 2 is a TEM which shows an insulating layer approximately 1 nm thick. This formation occurs at pressures between 0.5 and 0.1 Torr at high flow rates. To eliminate this condition, a gas which forms more radicalized fluorine, such as $NF_3$ may be used.

Figure 3:
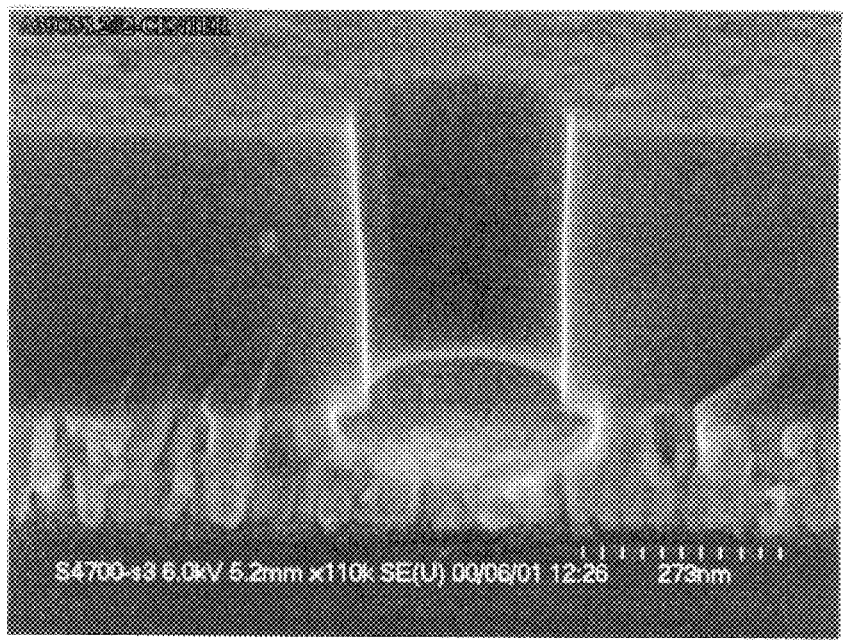
FIG. 3 is a photo of magnification—showing attack of the oxide interface of the tungsten layer at the bottom of the contact when the oxide interface is penetrated with too aggressive fluorine chemistry to create a void.

Another embodiment of veil removal for removing the remaining resist layer as well as the polymer deposited during the via etch is through use of a chemistry including $O_2$, $N_2$, and $H_2$. After the resist is removed, polymer removal is affected using $CF_4$, $N_2$, and $H_2$. It is during this polymer removal step that the tungsten layer is etched to provide the undercut. This process results in a via shaped as shown in FIG. 3. In FIG. 3, attack of the tungsten at the bottom of the contact may be seen.

Boundary condition 2 is one, which limits the process parameters due to rapid tungsten metal attack. The tungsten attack is by the fluorine chemistry. As may be seen in FIG. 3, when the oxide interface is penetrated with too aggressive of a chemistry, the tungsten is attacked, thereby leaving a void. The attack of the tungsten is most affected by the following: high fluorine concentration; too high power (W); and too high temperatures that increase the etch rate of the resist that also increase the etch rate of the tungsten.

The invention process has developed optimization over a wide range of flows, powers, pressure and time variation to affect dry polymer and oxide veil removal and C1 polymer removal that provides a better surface for the tungsten contact to adhere to.

Dry Polymer Removal for Post Etch Cleaning of Vias Landed on Tungsten

In the context of the invention, there is a maximum and minimum total fluorine source flow that varies with total gas flow and fluorine source. The fluorine source of $CF_4$ works best and was chosen to prepare graphs to show the process window vs. total gas flow and $CF_4$ flow.

Figure 4:
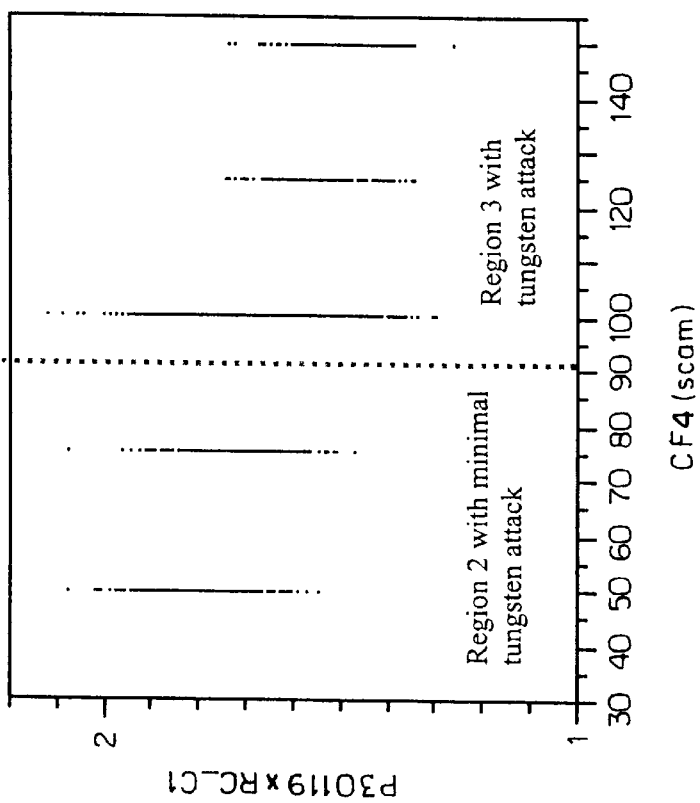
FIG. 4 is a plot of contact resistance versus $CF_4$, wherein total gas flow was held at 200 sccm.
Figure 5:
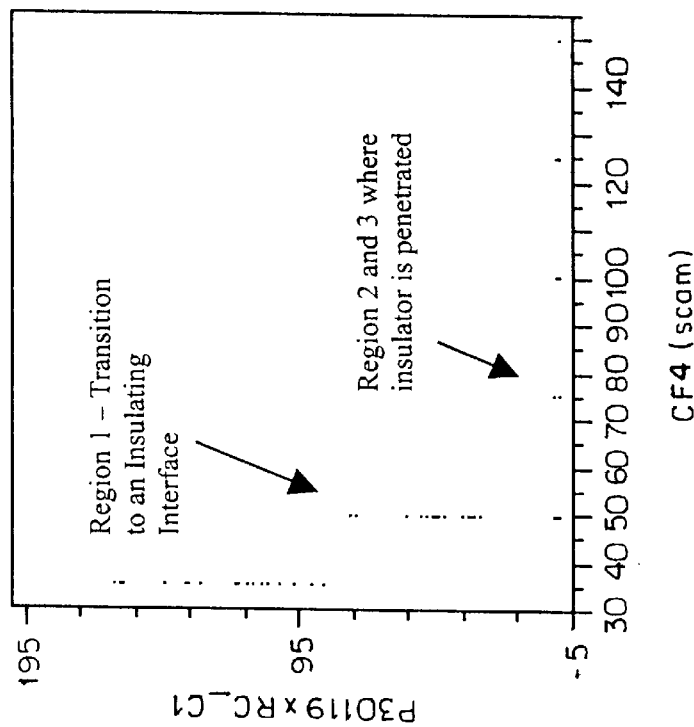
FIG. 5 is a plot of contact resistance versus $CF_4$ wherein the total gas flow was held at 200 sccm and the data for region 1 from FIG. 4 was removed.

FIG. 4 is a graph showing the effect of $CF_4$ flow on contact resistance when holding the power, pressure, and total gas flow constant at 200 sccm. FIG. 5 is the same graph with region 1 removed from the data set.

Region 1 is the area where an interfacial insulator causes extremely high contact resistance and causes the lots to not operate.

Region 2, as seen in FIG. 5 is where only slight amounts of the tungsten are attacked and thereby causes contact resistances similar to that obtained by wet chemistries. As the tungsten is attacked, region 3 occurs due to an extremely high amount of tungsten etching. Region 3 saturates at a given contact resistance until the tungsten experiences failures.

In the graph of FIG. 5, where contact resistance vs. $CF_4$, the total gas flow was held at 200 sccm and the data for region 1 was removed.

Figure 6:
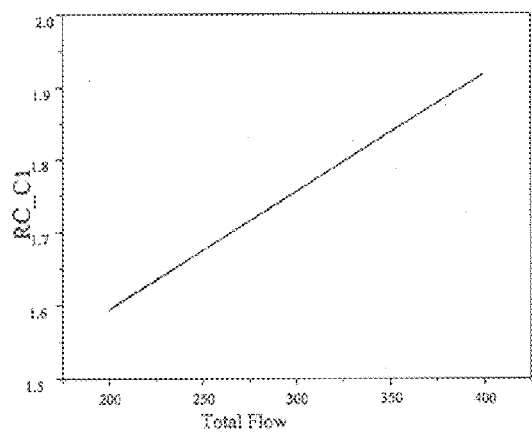
FIG. 6 is a graph showing the effect of total flow on contact resistance when holding the power, pressure, and $CF_4$ flow constant, and wherein the flow is in sccm.

As the total flow is increased and the $CF_4$ to reducing gas ratio is held constant at 0.5, the contact resistance increases as seen in the graph of FIG. 6. Therefore, for $CF_4$, there exists a process window to work within when holding power constant and pressure constant that is bound by the two boundary conditions previously described. As maybe seen, the process window for $CF_4$ increases as the total flow is increased.

Figure 7:
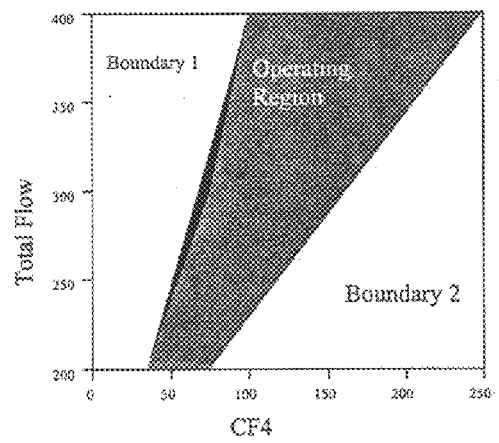
FIG. 7 is a graph showing the available process window when holding the power at 275 W and the pressure constant at 0.3 Torr.

Referring now to FIG. 7, a graph is shown of the available process window when holding the power (275 W) and pressure constant (0.3 Torr). In FIG. 7, boundary conditions 1 and 2 define the available process window. The flows are in sccm.

Figure 8:
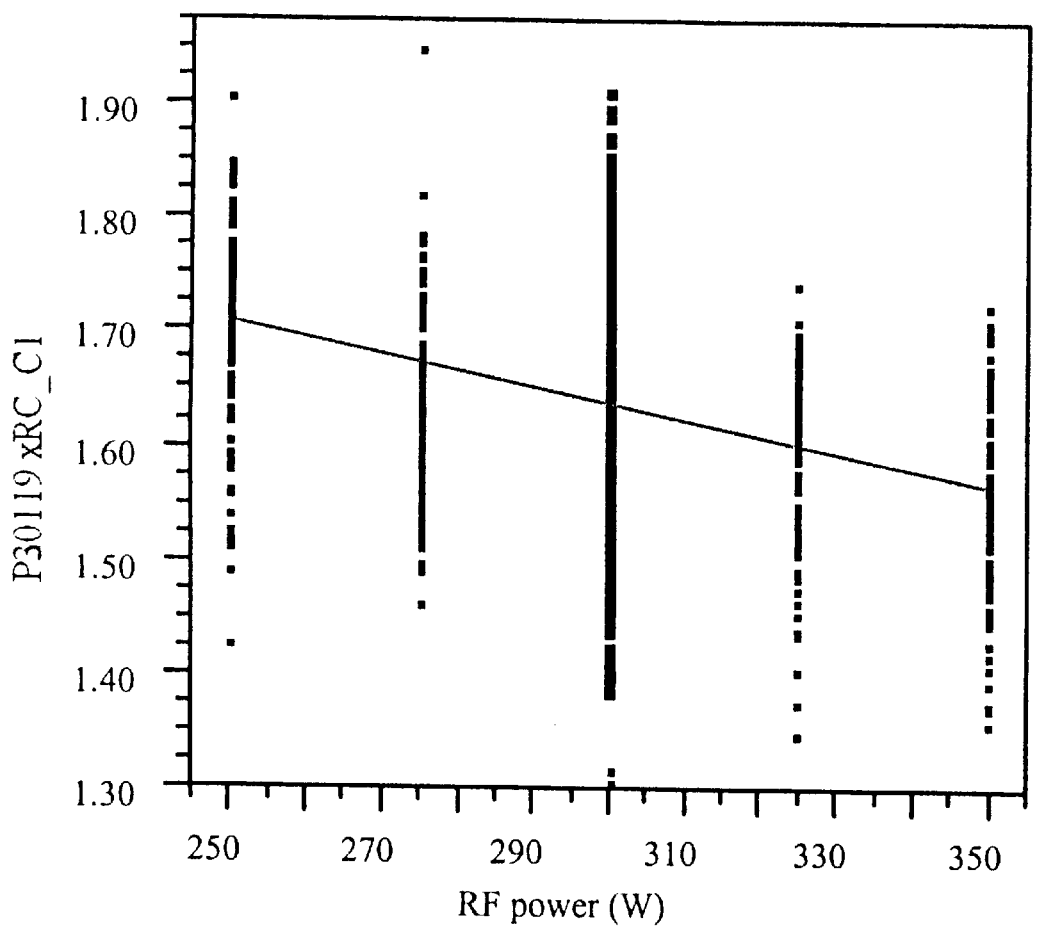
FIG. 8 is a graph showing the effect of power on the contact resistance.

In the context of the invention process window, the power effects are significant and the specific role that power plays in the process window is shown in FIG. 8. In this figure, the effect of power on contact resistance is such that, increasing the power decreases the contact resistance. Most of the resistance change is consuming tungsten. Further, the spread in the data is associated with variations in the $CF_4$ used in the test. Once an appropriate $CF_4$ flow is determined, power follows the typical response by increasing the amount of etch of the oxide barrier and tungsten. Power needs to be tuned with the $CF_4$ flow until an appropriate contact resistance is achieved.

Typical process conditions for storing source flow of $CF_4$ and $NF_3$ are shown in Tables I and II.

TABLE I $CF_4$ Based Process a. Temperature range: 200° C. to 275° C.
b. Pressure: 0.05 Torr to 0.5 Torr
c. $CF_4$ flow operation flow verses reducing gas flow: (See FIG. 7)
d. $CF_4$ min = .316*Reducing Gas Flow − 14.5
e. $CF_4$ max = 7*Reducing Gas Flow − 800
f. Reducing gases: Forming gas ($N_2$ {100 − X%}/$H_2$(X%))
   Argon, Nitrogen, Helium · where X= 0–10
g. Total Gas Flow 200 sccm to 500 sccm
h. RIE Power Density: 150 W to 500 W (Set depending on the gas flow and temperature operation)
Preferred process based on the process parameter range
   Temp = 255° C.
   Pressure = 0.3 Torr
   $CF_4$ = 60 sccm
   $N_2H_2$ = 140 sccm
   Power = 275 Watt

TABLE II $NF_3$ Based Process a. Temperature range: 200° C. to 275° C.
b. Pressure: 0.1 Torr to 0.5 Torr
c. $NF_3$ min = 0.11*Reducing Gas Flow − 18
d. $NF_3$ max = 0.11*Reducing Gas Flow
e. Reducing gases:
   Forming gas ($N_2$ {100 − X%}/$H_2$(X%))
   Argon, Nitrogen, Helium · where X= 0–10
   Total Gas Flow 400 sccm to 600 sccm
f. RIE Power Density: 75 W to 300 W
Preferred process based on the process parameter range
   Temp = 255° C.
   Pressure = 0.3 Torr
   $NF_3$ = 30 sccm
   $N_2H_2$ = 470 sccm
   Power = 150 Watt In the invention aspect of providing improved C1 contact adhesion after removal of the polymer, the C1 polymer removal process provides a better surface for the tungsten contact to adhere to. That is, in the polymer veil removal process for vias landed on tungsten, the tungsten base layer is partially removed, thereby resulting in an undercut of the via. The undercutting of the via provides better plug adhesion when the via is filled. While not wishing to be bound by any theory, it is believed that the better surface topography for the contact interface is achieved. In this connection, reference is again made to prior art FIG. 1 which depicts the basic starting structure in which there are polymer veils and a tungsten interface. It is this veil material removal and the control of the tungsten interface that is the focus of the invention process.

The resist is removed using a chemistry including $O_2$, $N_2$, and $H_2$. After the resist is removed, the polymer removal entails using $CF_4$, $N_2$, and $H_2$. During the polymer removal step the tungsten layer is etched to provide the undercut.

Figure 9:
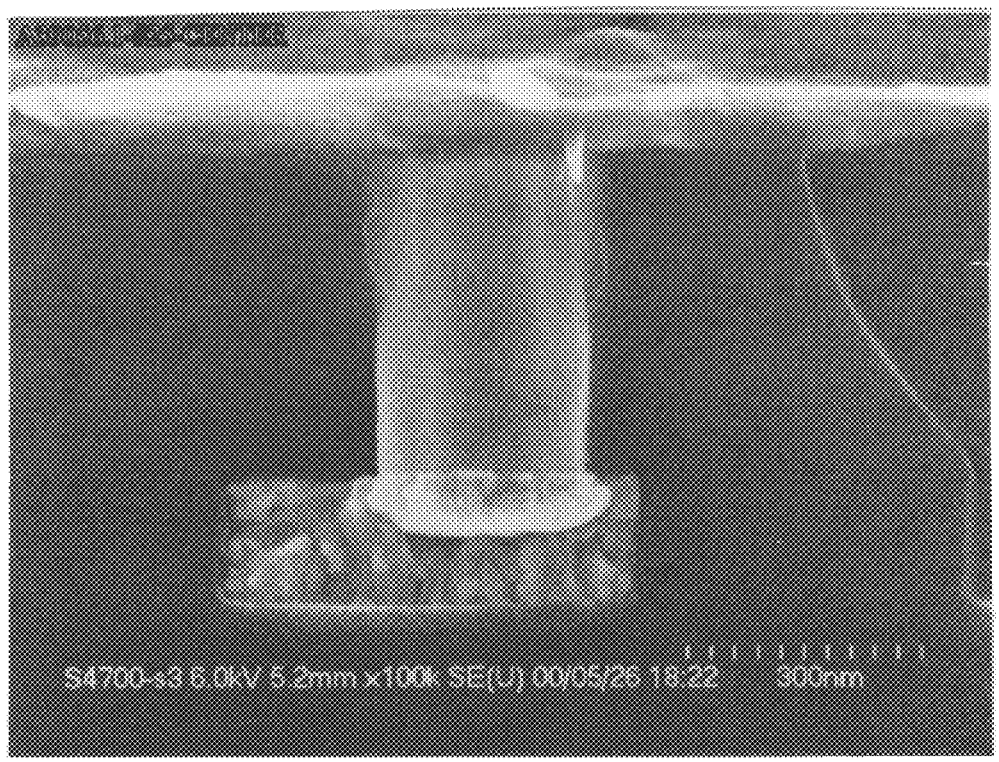
FIG. 9 is a photo showing typical process results after the tungsten fill of the via.

FIG. 9 shows typical process results after the via has been filled with tungsten, and the shape of the via provides a good foundation for the tungsten plug.

Figure 10:
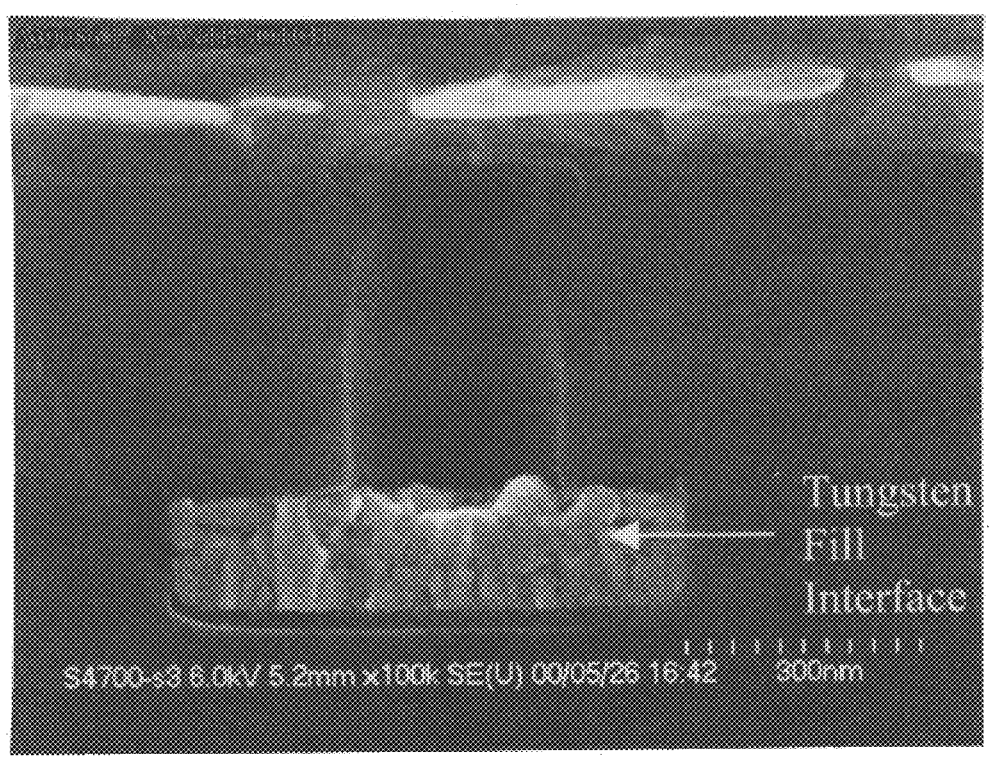
FIG. 10 is a photo showing a semiconductor in which a tungsten via fill interface is provided at increased strength after the undercut serves to strengthen the tungsten fill process subsequent to falling out of the tungsten plug during a cross-sectioning process.

A typical tungsten via fill interface is shown in FIG. 10, which demonstrates the benefit of this alternative process. In this figure, a tungsten plug has fallen out during the cross-sectioning process. However, the interface between the tungsten fill and the base tungsten layer can still be clearly seen. This demonstrates that the undercut serves to strengthen the tungsten fill process. As a result, fewer contacts are lost during normal wafer processing due to the increased strength of the tungsten interface.

TABLE III shows the process parameters for this alternative aspect of the invention.

TABLE III

| Parameter | Resist Removal Process | Polymer Removal Process |
|---|---|---|
| Duration (seconds) | 30–40 | 15–20 |
| Gas 1 - $O_2$ sccm | 9000–9500 | 0 |
| Gas 3 - $NF_3$ sccm | 0 | 0 |
| Gas 4 - $CF_4$ sccm | 0 | 60–70 |
| Gas 5 - $N_2H_2$ sccm | 480–525 | 130–150 |
| APC Pressure (Torr) | 2.0–2.5 | 0.2–0.5 |
| Hot Plate Temp. (° C.) | 250–260 | 250–260 |
| RF Forward (Watts) | 0 | 250–300 |
| Microwave Fwd (Watts) | 1500–3000 | 0 |

A result of this alternative process, a unique undercut of the tungsten based layer is achieved and this provides fewer contacts lost during normal wafer processing due to the increased strength of the tungsten interface.

We claim:

1. In a process of preparing a via in a semiconductor substrate wafer in which vias are landed on tungsten, and in which resist is stripped using plasma or chemical based processes that do not remove the veils formed during the etch, the improvement of concurrently removing veil material, controlling the interface of the tungsten, and stripping said resist, comprising:

a) depositing and patterning tungsten on a substrate;
   b) depositing an oxide as an interlevel dielectric on the tungsten;
   c) patterning the oxide using photolithography and a photoresist;
   d) etching the oxide using a plasma generated etching method in which veils made up of metals, carbon based materials and oxide based materials are formed on the tungsten and sidewalls of the vias; and
   e) stripping the resist using a dry polymer removal method employing process gases and reducing gases to concurrently cause resist stripping, removal of said veils, and control of said tungsten interface.

2. The process of claim 1 wherein said dry polymer removal method to concurrently cause resist stripping, removal of said veils and control of said tungsten interface comprises placing said wafer in a vacuum and subjecting said wafer to sufficient microwave frequency downstream plasma and RIE at sufficient radio frequencies to affect resist stripping, removal of the veils and control of the tungsten interface.

3. The process of claim 2 wherein said process gases are fluorine based gases and said reducing gases are selected from the group consisting of $N_2\{100\%-X\%\}/H_2\{X\%\}$, argon, nitrogen and helium; where X=0–10.

4. The process of claim 3 wherein said fluorine based gases is selected from the group consisting of $CF_4$ and $NF_3$.

5. The process of claim 4 wherein said fluorine based gas is $CF_4$; said $CF_4$ gas flow is between about 7 times reducing gas flow minus 800 to about 0.316 times reducing gas flow minus 14.5; the total gas glow is from between about 200 to about 500 sccm and the temperature range is from about 200° C. to about 275° C.

6. The process of claim 6 wherein said microwave frequency plasma is at a power of about 275 W and said RIE radio frequency is at a power density of between about 150 W to about 500 W.

7. The process of claim 4 wherein said fluorine based gas is $NF_3$; said $NF_3$ gas flow is between about 0.11 times reducing gas flow minus 18 to about 0.11 times reducing gas flow; the total gas flow is from between about 400 to about 600 sccm; and the temperature range is from about 200° C. to about 275° C.

8. The process of claim 7 wherein said microwave frequency plasma is at a power of about 150 W and said RIE is radio frequency at a power density of between about 75 to about 300 W.

9. The process of claim 5 wherein pressure is between about 0.05 to about 0.5 Torr.

10. The process of claim 7 wherein pressure is between about 0.1 to about 0.5 Torr.

11. In a process of preparing a via in a semiconductor substrate wafer in which vias are landed on tungsten, and in which resist is stripped using a chemistry including $O_2$, $N_2$ and $H_2$, the improvement of using $CF_4$, $N_2$ and $H_2$ to remove polymer while providing a better surface for tungsten contact to adhere to, comprising:

a) depositing and patterning tungsten on a substrate;
   b) depositing on oxide as an interlevel dielectric on the tungsten;
   c) patterning the oxide using photolithography and a photoresist;
   d) etching the oxide using a plasma generated etching method in which veils made up of metals, carbon based materials and oxide based materials are formed on the tungsten and sidewalls of the vias;
   e) stripping the resist using a chemistry including $O_2$, $N_2$ and $H_2$; and
   f) removing the polymer using $CF_4$, $N_2$, and $H_2$ while simultaneously etching said tungsten layer to provide a tungsten undercut of improved surface topography for a contact interface.

12. The process of claim 11 wherein said $CF_4$, $N_2$ and $H_2$ polymer removal method comprises placing said wafer in a vacuum and subjecting said wafer to sufficient RF to remove polymer while providing undercut for said tungsten layer.

13. The process of claim 12 wherein said $CF_4$, $N_2$ and $H_2$ polymer removal process proceeds at RF of from about 250 to about 300 W.

14. The process of claim 13 wherein said $CF_4$, $N_2$ and $H_2$ polymer removal process proceeds at a temperature range of from about 250° C. to about 260° C.

15. The process of claim 14 wherein said $CF_4$, $N_2$ and $H_2$ polymer removal process proceeds at a $CF_4$ flow rate of from about 60 to about 70 sccm, and a $N_2H_2$ flow rate of from about 130 to about 150 sccm.

16. The process of claim 15 wherein the pressure is between about 0.2 to about 0.5 Torr.

* * * * *